United States Patent [19]

Sarkhel et al.

[11] Patent Number: 6,010,060
[45] Date of Patent: Jan. 4, 2000

[54] LEAD-FREE SOLDER PROCESS

[75] Inventors: Amit Kumar Sarkhel, Endicott; Charles G. Woychik, Vestal, both of N.Y.

[73] Assignee: International Business Machines Corporation, Armonk, N.Y.

[21] Appl. No.: 09/054,375

[22] Filed: Apr. 2, 1998

Related U.S. Application Data

[62] Division of application No. 08/768,907, Dec. 17, 1996, Pat. No. 5,874,043
[60] Provisional application No. 60/019,589, Jun. 12, 1996.

[51] Int. Cl.[7] .................................................. H05K 3/34
[52] U.S. Cl. ................................ 228/179.1; 228/180.1; 228/180.21; 228/248.1
[58] Field of Search .......................... 228/179.1, 180.1, 228/180.21, 180.22, 248.1; 148/24; 29/840; 420/557, 560, 561, 562

[56] References Cited

U.S. PATENT DOCUMENTS

| | | |
|---|---|---|
| 5,256,370 | 10/1993 | Slattery et al. . |
| 5,328,660 | 7/1994 | Gonya et al. . |
| 5,520,752 | 5/1996 | Lucey, Jr. et al. ................... 148/400 |
| 5,580,520 | 12/1996 | Slattery et al. ..................... 420/557 |
| 5,762,866 | 6/1998 | Jin et al. ............................ 420/557 |

FOREIGN PATENT DOCUMENTS 0 612 578   8/1994   European Pat. Off. .

*Primary Examiner*—Samuel M. Heinrich
*Attorney, Agent, or Firm*—John R. Pivnichny

[57] ABSTRACT

A high solidus temperature, high service temperature, high strength ternary solder alloy, solder paste and method. The alloy contains a major proportion of tin of at least about 70% by weight, a selectively limited amount of silver from about 6.5 to about 7.5% by weight, balance indium.

5 Claims, 2 Drawing Sheets

6,010,060

LEAD-FREE SOLDER PROCESS

This is a Division of Ser. No. 08/768,907 filed Dec. 17, 1996, now U.S. Pat. No. 5,874,043 provisional application No. 60/019,589 filed Jun. 12, 1996.

FIELD OF THE INVENTION

The present invention relates to a high solidus temperature, high strength, lead-free, low toxicity, ternary solder alloy that is particularly useful in microelectronic applications.

BACKGROUND OF THE INVENTION

Solders are used in low temperature, usually reversible, metallurgical joining processes. Low temperature solders with reversibility are especially important in electronic applications. The low temperature is required since many materials are damaged by even moderately high temperatures. The reversibility is required since reworking of products is often necessary. Low temperature soldering is extremely well suited for this.

Solder joining is a wetting process followed by a chemical reaction. Molten solder wets the substrate selectively. The selective wettability of the solder allows molten solder to be confined to metallic pads and not to solder mask materials. This is especially important in flip Chip bonding and surface mount attachment of Components such as quad flat packs, and ball grid array modules.

The soldering process takes place virtually as quickly as the wetting process once the solder has melted. For example, with rapid heating soldering can take place in just a few seconds. This makes soldering particularly desirable for automated, high-speed, high through-put processes.

Wettability is not only a function of the solder material, but is also a function of the materials to be joined by the solder, such as copper, nickel, gold and palladium, as well as those rich in one or more of these metals which are particularly amenable to soldering.

Chemical reaction following wetting occurs between the liquid solder and the materials being joined, which forms intermetallic phases at the interfaces. The intermetallic phases formed by solders in electronic packaging are stoichiometric compounds, typically binary compounds are typically containing tin if tin is present in the solder alloy. If one of the metals to be joined is copper and the solder alloy in rich in tin, the intermetallic compound formed during soldering is Cu—Sn. Cu—Sn binaries include $Cu_3Sn$ and $CU_6Sn_5$, although other intermetallics may be formed, Solder alloys are characterized by the melting temperature being a function of composition. Thus, while a pure metal is characterized by a single invariant melting temperature, the freezing and melting points of alloys are complex. The freezing point of an alloy is determined by the liquidus line, wherein only a liquid phase exists above the liquidus line. The melting point of an alloy is determined by the solidus line, wherein only solid phase or phases can exist below the solidus line. In the region between the solidus and liquidus lines, solid and liquid phases generally co-exist. Many soldering alloys are eutectic; i.e., they are characterized by a eutectic point. The eutectic point is where the liquidus and solidus lines meet, and thus there is a single melting temperature representing both the liquidus and solidus temperature. A change in concentration of the element in either direction from the eutectic composition results in an increase in the liquidus temperature, and also generally in a separation between the liquidus and solidus lines, with liquid and solid phases therebetween as indicated above. The composition and quench rate also determine the microstructure and resulting mechanical properties of a solder joint. Thus, it is necessary to both carefully choose the solder composition and to control the thermal exposure and thermal excursions of the solder joint.

One very common type of solder composition used in electronics fabrication is the tin/lead alloys. These alloys are capable of forming electrically-conductive, thermally stable, non-brittle intermetallics with the material being joined. One particular alloy that is well known is a eutectic tin/lead composition which contains about 63% tin and 37% lead. This particular alloy, being a eutectic, has a melting point of about 163° C. (compared to Sn which has a melting point of 232° C. and Pb which has a melting point of 327° C.). This low melting point, plus the workability the lead/tin alloys and the adhesion of the copper/tin intermetallics over wide temperature range, and the availability of equipment and related materials for the process has made the tin/lead alloys extremely desirable. This relatively low temperature in non-damaging to most electronic components and other materials such as organic substrates, and the process is reversible.

Another important characteristic of this material is the softness or plasticity of these lead-base solders. This softness or plasticity allows the solder to accommodate the mismatch in coefficients of thermal expansion of bonded structures. For example, the mismatch in coefficients of thermal expansion between a ceramic dielectric and a polymeric dielectric, or between a semiconductor chip and a ceramic or polymeric chip carrier or substrate, can readily be accommodated.

However, one major drawback to the tin/lead alloys is that lead is toxic and has a relatively high vapor pressure. Thus, while in many cases there is not a large amount of lead present, nevertheless the accumulation of lead, even in small amounts, can be unacceptable and thus the use of lead is becoming more and more disfavored, with a replacement for the lead being required.

U.S. Pat. No. 5,256,370 to Slattery, et al. suggests certain solder alloys containing Sn, Ag, and In where Ag is specifically limited to less than 6% by weight. Also, U.S. Pat. No. 5,328,660 to Gonya, et al., suggests a quaternary solder alloy of 78% Sn, 2% Ag, 9.8% Bi, and 9.8% In. U.S. Pat. No. 4,998,342 and 4,761,881 suggest pin-in-hole and surface mount assemblies using wave soldering and solder paste. These patents are incorporated herein in whole by reference.

SUMMARY OF THE INVENTION

A ternary lead free solder has been discovered in accordance with the present invention that wets and forms a chemically and thermally stable bond with a bonding metallurgy of solders typically used in electronics fabrication and which has properties close to tin/lead alloys particularly an alloy of 63% tin and 37% lead. The ternary lead free solder of the present invention consists essentially of tin, silver and indium with a relatively high Ag content of between about 6.5% and about 7.5% resulting in enhanced solder flow characteristics and greater ductility at low temperature which prevents damage to electronic materials.

The subject invention is directed, in one embodiment, to a ternary solder alloy which is lead free, of high strength and particularly well suited for microelectronic applications with the ternary solder alloy consisting essentially of an amount of silver selectively limited to between about 6.5% and about 7.5% by weight, at least about 70 weight percent tin balance indium. The tin concentration should preferably be limited to between 70.5 and 73.5% with the concentration of indium between about 19–23 weight percent.

The subject invention is further directed to a solder paste comprising a flux, an organic vehicle and particles of metal in a composition consisting essentially of a major proportion of tin by weight of at least about 70%, an amount of silver selectively limited to between about 6.5 and about 7.5 weight percent balance indium. More preferably, the tin concentration should be between about 70.5 to 73.5 weight percent.

The subject invention is further directed to a method of joining microelectronic components with a ternary solder alloy consisting essentially of a major proportion of tin by weight, an amount of silver selectively limited to between about 6.5 and about 7.5 weight percent balance indium. More preferably, the tin concentration should also be between about 70.5 to 73.5 weight percent.

An even further embodiment of the present invention is directed to a process for producing circuit boards comprising: producing plated through holes in a circuit board; inserting the pins of pin-in-hole components into the plated through holes; producing a stationary wave of liquid solder consisting essentially of a major concentration by weight of tin of at least about 70%, an amount of silver selectively limited to between about 6.5 and about 7.5% by weight balance indium; moving the circuit board across the wave with the bottom of the circuit board in contact with the wave, thereby substantially filling the plated through holes with solder; and cooling the circuit board to form solid solder joints.

In addition the subject invention includes a process for producing circuit boards comprising the steps of: producing substrates with multiple wiring layers including exposed metal pads on a surface; forming a solder paste comprising a flux, an organic vehicle and particles of metal consisting essentially of a major proportion of tin by weight of at least about 70 wt %, an amount of silver selectively limited to between about 6.5 and about 7.5% by weight, and with the balance indium; depositing the solder paste upon said substrates; placing terminals of a surface mount component onto corresponding pads of the substrate; heating said solder paste to a temperature sufficient to reflow the solder paste to connect the component with the substrate; and cooling to solidify the connections.

DETAILED DESCRIPTION OF THE INVENTION

A lead free high solidus temperature, high strength, ternary solder alloy or paste is formed in accordance with the teaching of the present invention containing metal particles consisting essentially of a major proportion of tin of at least about 70 wt %, an amount of silver selectively limited to between about 6.5 and about 7.5% by weight, balance indium. Preferably, the concentration of tin should lie between 70.5 weight percent and 73.5 weight percent.

The optimum composition for the solder alloy or solder paste of the subject invention contains about 73.2 weight percent Sn, about 6.8 weight Ag, and about 20 weight percent In. The soldering melting temperature range for the solder and solder paste of the present invention is between about 185° C. and 241° C.

Figure 1:
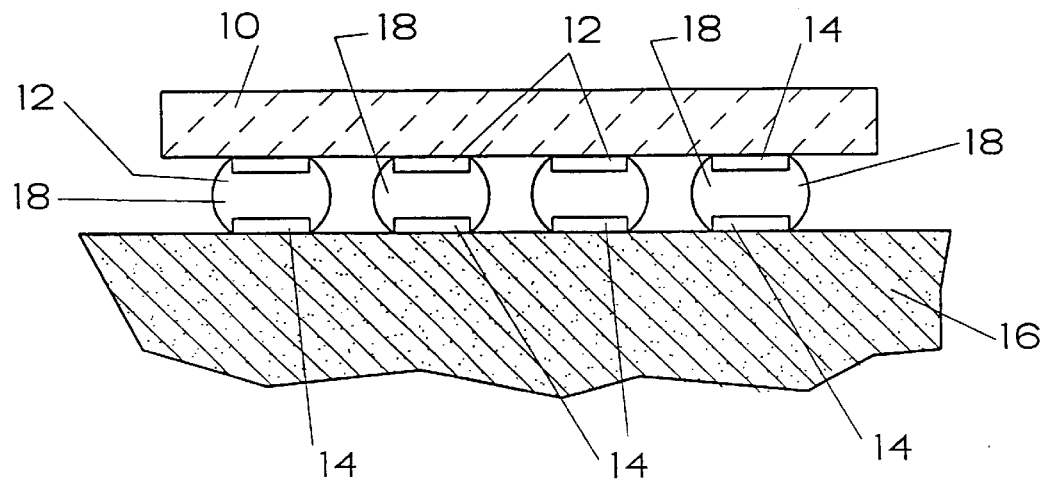
FIG. 1 is a schematic drawing showing the joining by "flip chips" bonding of an integrated circuit chip to a substrate using a ternary solder alloy or paste according to this invention.

The solder of the present invention may be used in the same manner as the tin/lead solder is currently used in microelectronic applications. FIG. 1 shows the solder of the present invention used for "flip chip bonding". An IC chip 10 having contact pads 12 thereon is shown bonded to bonding pads 14 on a dielectric substrate 16 by solder connection 18. The substrate can be a chip carrier or a planar board, and these substrates can be formed of ceramic or organic materials such as glass filled epoxies or polyimides or flexible laminates of patterned copper foil and dielectric polymeric films. The solder alloy is deposited on the pads 12 and/or 14, the chip is placed on the carrier, and the solder is melted to form the connections, and 20 then cooled to solidify.

During reflow, the assembly is heated to cause the solder alloy to wet and bond to the electrical contacts of the circuitized substrate. Heating may be by vapor phase reflow, laser reflow, oven melting, or by any other suitable means of heating to above the liquidus temperature. Other types of connections can be made between various components in microelectronics.

The resulting microelectric circuit package of the invention in FIG. 1 is an integrated circuit chip module with a circuitized chip carrier, i.e., a substrate, a semiconductor integrated circuit chip, and a tin/silver/indium alloy solder bond electrically interconnected between the circuitized chip carrier and the semiconductor integrated circuit chip.

Moreover the process is reversible in that to "desolder", the soldered board is heated to above the liquidus temperature, and the soldered components separated. This allows for replacement of any defective parts or connections.

Figure 2:
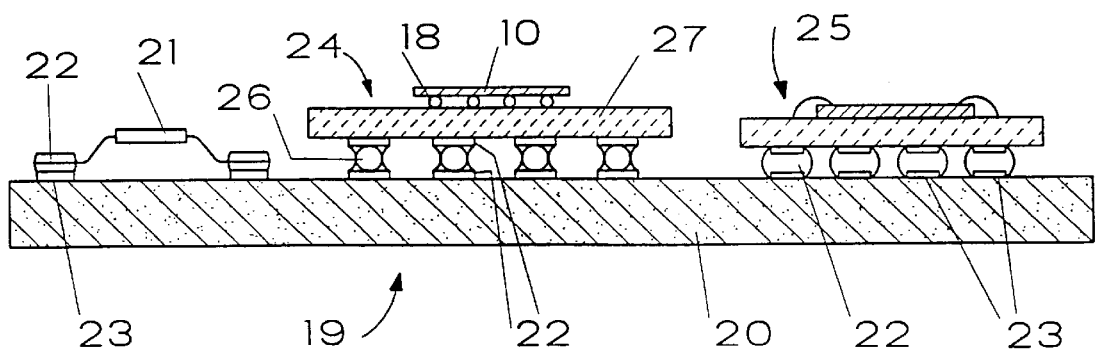
FIG. 2 is a schematic of a circuit board showing surface mount components attached to a circuit board by reflowing solder paste.

FIG. 2 shows a circuit board assembly 19 of the invention which includes a card 20 which may be any known printed circuit board substrate, and surface mount components such as a gull-wing or J-leaded component 21 which may be a quad flat pack, dual in-line package, small outline integrated circuit package or other well known surface mount component. The component 21 is attached by applying, preferably by screening, solder paste on copper pads 23, placing the leads of the component on the pads and reflowing the solder in an oven at a reflow temperature 20–30° above the liquidus temperature.

The solder paste is composed of a flux material and a vehicle comprised of various organic materials to control the properties such an the rheology of the paste with the solder particles dispersed therein. The flux and organic vehicles are selected for various different applications as is well known in the art. Typically, the metal solder particles will constitute about 90% by weight of the solder paste.

The solder paste reflows to produce a solder joint 22 of an alloy containing Sn, Ag, and In, with a liquidus temperature less than about 185° C. More preferably the paste contains alloy particles of 70.5–73.5% Sn by weight, 6.5%–7.5% Ag balance In. The mechanical properties of the solder and solder paste of the present invention approaches that of the conventional tin/lead binary solder particularly with respect to its strength and ductility characteristic.

In a similar manner, ball grid array modules 24 and 25 of the invention may be attached to the card by applying, preferably by screening, solder paste of the invention onto metal pads or onto the balls, placing the module with balls on the pads and reflowing. Chip carrier 24 includes spherical preforms or balls 26 with solidus temperature significantly above the reflow temperature of the solder paste. The balls may be pre-attached to the underside of the chip carrier substrate 27 by welding or more preferably by using the solder of the present invention. The flip chip on the top of the module 24 may be connected as previously described with reference to FIG. 1. Module 25 of FIG. 2 may include solder bumps of the solder of the invention and/or paste of the invention may be screened on an array of pads 23 and connected by reflowing as described above to form the solder joints 22.

Figure 3:
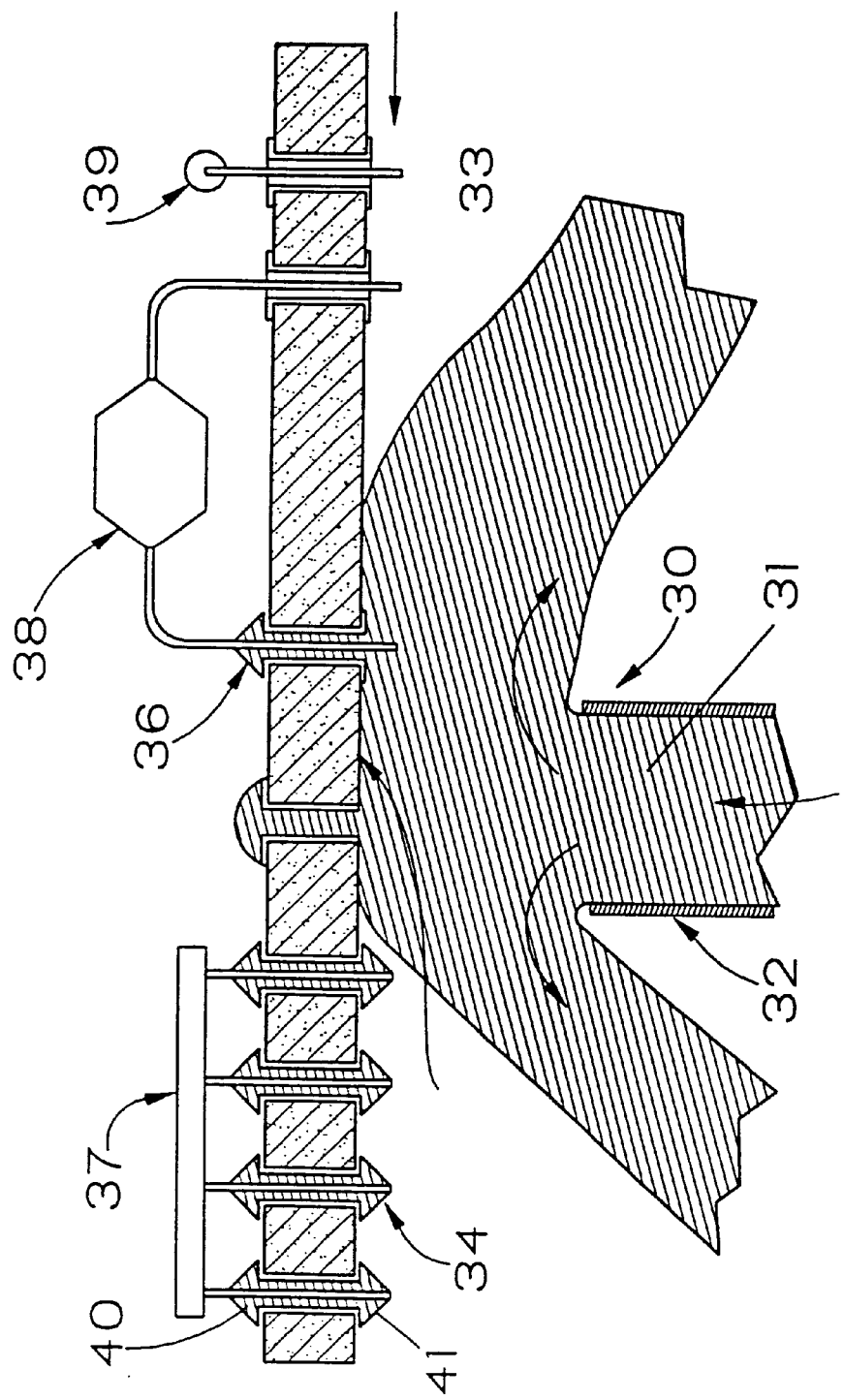
FIG. 3 is a schematic of a circuit board showing pin-in-hole components attached by wave soldering.

FIG. 3 shows a wave solder machine 30 where molten solder 31 of the invention is pumped up through nozzle 32 to form an elongate wave 33 across which a circuit board assembly 34 is moved. The wave contacts across the bottom surface 35 of the assembly and the solder flows into holes 36 which are plated with metal such as copper to which the solder wets in order to provide capillary action which draws the solder up into the holes. The pins of pin-in-hole components such as pin grid array chip carrier 37 and dual in-line package 38 and discrete components 39 such as resistor and capacitors, are inserted into the holes. Top joints 40 and bottom joints 41 are formed of the solder of the invention.

Accordingly, the preferred embodiment of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of joining at least two microelectronic components to one another comprising the steps of connecting the components to be joined with a ternary solder alloy consisting essentially of tin of at least about 70 weight percent, a selectively limited amount of silver from about 6.5 to about 7.5 weight percent, balance indium.

2. A method as defined in claim 1 wherein said solder alloy consists essentially of from about 70.5 to 73.5 weight percent tin, from about 6.5 to about 7.5 weight percent silver, balance indium.

3. A method as defined in claim 2 wherein said solder alloy consists essentially of about 73.2 weight percent tin, about 6.5 weight percent silver, balance indium.

4. A process for producing circuit boards, comprising the steps of:
    producing plated through holes in a circuit board;
    inserting the pins of pin-in-hole components into the plated through holes;
    producing a stationary wave of liquid solder consisting essentially of tin of at least about 70% by weight, an amount of silver selectively limited to between about 6.5 and about 7.5% by weight and with the balance indium;
    moving the circuit board across the wave with the bottom of the circuit board in contact with the wave, thereby substantially filling the plated through holes with solder; and
    cooling the circuit board to form solid solder joints.

5. A process for producing circuit boards comprising the steps of:
    producing a substrate with multiple wiring layers including exposed metal pads on a surface;
    forming a solder paste comprising a flux, an organic vehicle and particles of metal consisting essentially of tin of at least about 70% by weight, an amount of silver selectively limited to between about 6.5 and about 7.5% by weight and with the balance indium;
    depositing the solder paste upon said substrate;
    placing terminals of a surface mount component onto corresponding pads of the substrate;
    heating said solder paste to a temperature sufficient to reflow the solder paste to connect the component with the substrate; and cooling to solidify the connections.

* * * * *